US012784806B2

(12) United States Patent
Gu

(10) Patent No.: US 12,784,806 B2
(45) Date of Patent: Nov. 3, 2026

(54) REFRESH CONTROL CIRCUIT AND MEMORY

(71) Applicant: CXMT Corporation, Hefei City (CN)

(72) Inventor: Yinchuan Gu, Hefei City (CN)

(73) Assignee: CXMT Corporation, Hefei City (CN)

( * ) Notice: Subject to any disclaimer, the term of this patent is extended or adjusted under 35 U.S.C. 154(b) by 76 days.

(21) Appl. No.: 18/964,499

(22) Filed: Dec. 1, 2024

(65) Prior Publication Data

US 2025/0095710 A1 Mar. 20, 2025

Related U.S. Application Data

(63) Continuation of application No. PCT/CN2024/086714, filed on Apr. 9, 2024.

(30) Foreign Application Priority Data

Apr. 19, 2023 (CN) ........................ 202310436851.X

(51) Int. Cl.
*G11C 7/00* (2006.01)
*G11C 11/406* (2006.01)
*G11C 11/408* (2006.01)

(52) U.S. Cl.
CPC .................. *G11C 11/40618* (2013.01); *G11C 11/40615* (2013.01); *G11C 11/4087* (2013.01)

(58) Field of Classification Search
CPC ........ G11C 11/40618; G11C 11/40615; G11C 11/4087; G11C 11/40611; G11C 11/401; G11C 11/406; G11C 11/40603; G11C 11/40622; G11C 11/4078; G11C 11/408
USPC .......................................................... 365/222
See application file for complete search history.

(56) References Cited

U.S. PATENT DOCUMENTS 7,911,867 B2 * 3/2011 Lee ....................... G11C 11/406 365/236
9,076,548 B1 * 7/2015 Park ................... G11C 16/3418
9,922,728 B2 * 3/2018 Park ................. G11C 29/50016
2004/0047221 A1 * 3/2004 Tanaka .............. G11C 11/40603 365/222

* cited by examiner

*Primary Examiner* — Tha-O H Bui
(74) *Attorney, Agent, or Firm* — Syncoda LLC; Feng Ma

(57) ABSTRACT

A refresh control circuit includes a control circuit, a counter circuit, and an indication circuit. When a refresh management feature is disabled, the control circuit outputs an all-bank normal refresh request or a same-bank normal refresh request according to an address command signal if the indication circuit outputs an invalid indication signal, or the control circuit outputs an all-bank refresh management refresh request or a same-bank refresh management refresh request according to a received address command signal if an indication signal is valid. The counter circuit counts an accumulative quantity of same-bank refreshes, and performs resetting in response to a counting result reaching a set upper limit value or an all-bank refresh request. The indication circuit outputs the valid indication signal if the counting result is in a preset range, or outputs the invalid indication signal if the counting result is not in a preset range.

12 Claims, 6 Drawing Sheets

REFRESH CONTROL CIRCUIT AND MEMORY

CROSS-REFERENCE TO RELATED APPLICATIONS

This application is a continuation of International Patent Application No. PCT/CN2024/086714 filed on Apr. 9, 2024, which claims priority to Chinese Patent Application No. 202310436851.X filed on Apr. 19, 2023. The disclosures of the above-referenced applications are hereby incorporated by reference in their entirety.

BACKGROUND

As memory technologies develop, memories are widely used in various fields, for example, a dynamic random access memory (DRAM) is widely used.

In actual application, as the size of a memory gets increasingly small and the integration degree gets increasingly high, interference exists between adjacent memory cells, which may lead to a row hammer (RH) vulnerability. Specifically, the RH vulnerability indicates that when a specific memory cell of the memory is repeatedly read and written for a plurality of times, data in another memory cell may be flipped. Therefore, an effective refresh control solution, for example, a refresh management (RFM) refresh, needs to be provided to control execution of an RH protection operation, to prevent a memory cell in a memory from being incorrectly flipped.

SUMMARY

This application relates to memory technologies, and in particular, to a refresh control circuit and a memory.

Embodiments of this application provide a refresh control circuit and a memory.

According to some embodiments, in a first aspect of this application, a refresh control circuit is provided. The refresh control circuit includes: a control circuit, a counter circuit, and an indication circuit. The control circuit is connected to an output terminal of the indication circuit, and is configured to: when a refresh management feature is disabled, output an all-bank normal refresh request or a same-bank normal refresh request according to a received address command signal if the indication circuit currently outputs an invalid indication signal, or output an all-bank refresh management refresh request or a same-bank refresh management refresh request according to a received address command signal if the indication circuit currently outputs a valid indication signal. The counter circuit is connected to an output terminal of the control circuit, and is configured to count an accumulative quantity of same-bank normal refresh requests and same-bank refresh management refresh requests that are continuously output by the control circuit, output a counting result, and perform resetting and start counting again in response to the current counting result reaching a set upper limit value or when the control circuit outputs the all-bank normal refresh request or the all-bank refresh management refresh request. The indication circuit is connected to an output terminal of the counter circuit, and is configured to output the valid indication signal if the current counting result is in a preset range, or output the invalid indication signal if the current counting result is not in a preset range.

In some embodiments, the control circuit is further configured to output an all-bank normal refresh request, a same-bank normal refresh request, an all-bank refresh management refresh request, or a same-bank refresh management refresh request according to a received address command signal when the refresh management feature is enabled. The address command signal includes a first address command and a second address command. Different level states of the first address command respectively represent a normal refresh type and a refresh management refresh type. Different level states of the second address command respectively represent an all-bank refresh type and a same-bank refresh type.

In some embodiments, the control circuit includes: a first control sub-circuit, configured to receive a mode register instruction, the first address command, and the indication signal to detect whether the refresh management feature is enabled according to the mode register instruction and output a first signal with reference to the first address command and the indication signal, a first signal consistent with the first address command being output if the refresh management feature is enabled, or if the refresh management feature is disabled, a first signal representing the normal refresh type being output in response to the current invalid indication signal, and a first signal representing the refresh management refresh type being output in response to the current valid indication signal; a transmission circuit, configured to receive the second address command to output the second address command as a second signal after delaying the second address command by predetermined duration; and a decoding circuit, connected to the first control sub-circuit and the transmission circuit, and configured to receive the first signal and the second signal, and output a refresh request of a corresponding type according to level states of the first signal and the second signal in response to a refresh command.

In some embodiments, the first control sub-circuit includes a first NOT gate, a first NAND gate, a second NOT gate, a second NAND gate, and a first AND gate. A first input terminal of the first NAND gate receives the indication signal. An input terminal of the first NOT gate receives the mode register instruction. An output terminal of the first NOT gate is connected to a second input terminal of the first NAND gate. An output terminal of the first NAND gate is connected to a first input terminal of the first AND gate. A first input terminal of the second NAND gate receives the mode register instruction. An input terminal of the second NOT gate receives the first address command. An output terminal of the second NOT gate is connected to a second input terminal of the second NAND gate. An output terminal of the second NAND gate is connected to a second input terminal of the first AND gate. An output terminal of the first AND gate is configured to output the first signal. The refresh management feature is enabled when the mode register instruction is at a high level. The refresh management feature is disabled when the mode register instruction is at a low level. The indication signal is valid when the indication signal is at a high level. The indication signal is invalid when the indication signal is at a low level.

In some embodiments, the transmission circuit includes an even number of third NOT gates and a first buffer that are sequentially connected in series. An input terminal of a first third NOT gate receives the second address command. An output terminal of a last third NOT gate is connected to an input terminal of the first buffer. An output terminal of the first buffer is configured to output the second signal.

In some embodiments, the decoding circuit includes a first flip-flop, an input terminal of the first flip-flop receiving the first signal, an in-phase output terminal of the first flip-flop being configured to output a first sub-signal, an inverting output terminal of the first flip-flop being configured to output a second sub-signal, and a clock terminal of the first flip-flop receiving the refresh command; a second flip-flop, an input terminal of the second flip-flop receiving a second signal, an in-phase output terminal of the second flip-flop being configured to output a third sub-signal, an inverting output terminal of the second flip-flop being configured to output a fourth sub-signal, and a clock terminal of the second flip-flop receiving the refresh command; a second buffer, an input terminal of the second buffer receiving the refresh command, and the second buffer being configured to output the refresh command after delaying the refresh command; a first multi-input AND gate, an input terminal of the first multi-input AND gate being separately connected to the second sub-signal, the fourth sub-signal, and an output terminal of the second buffer, and the first multi-input AND gate being configured to output the all-bank refresh management refresh request; a second multi-input AND gate, an input terminal of the second multi-input AND gate being separately connected to the first sub-signal, the fourth sub-signal, and the output terminal of the second buffer, and the second multi-input AND gate being configured to output the all-bank normal refresh request; a third multi-input AND gate, an input terminal of the third multi-input AND gate being separately connected to the first sub-signal, the third sub-signal, and the output terminal the second buffer, and the third multi-input AND gate being configured to output the same-bank normal refresh request; and a fourth multi-input AND gate, an input terminal of the fourth multi-input AND gate being separately connected to the second sub-signal, the third sub-signal, and the output terminal of the second buffer, and the fourth multi-input AND gate being configured to output the same-bank refresh management refresh request.

In some embodiments, the counter circuit includes a counting clock circuit, a reset circuit, and a plurality of stages of third flip-flops corresponding to binary bits. The counting clock circuit is connected to the control circuit, and is configured to output a counting clock when the same-bank normal refresh request is received or when the current indication signal is valid and the same-bank refresh management refresh request is received. A clock terminal of the first stage of third flip-flop is connected to an output terminal of the counting clock circuit. A clock terminal of another third flip-flop is connected to an inverting output terminal of a previous stage of third flip-flop. An input terminal of each third flip-flop is connected to an inverting output terminal of the third flip-flop. A value output by an in-phase output terminal of each stage of third flip-flop constitutes an output of the counter circuit. The output is a binary representation of the counting result. An input terminal of the reset circuit is connected to output terminals of the control circuit and the plurality of stages of third flip-flops, and is configured to output a reset signal when the all-bank normal refresh request or the all-bank refresh management refresh request is received or when the counting result is the upper limit value. An output terminal of the reset circuit is connected to a reset terminal of each stage of third flip-flop.

In some embodiments, the counting clock circuit includes a second AND gate and a first OR gate. A first input terminal of the first OR gate receives the same-bank normal refresh request. A second input terminal of the first OR gate is connected to an output terminal of the second AND gate. An output terminal of the first OR gate is connected to the clock terminal of the first stage of third flip-flop as an output terminal of the counting clock circuit. A first input terminal of the second AND gate receives the same-bank refresh management refresh request. A second input terminal of the second AND gate receives the indication signal.

In some embodiments, the reset circuit includes a second OR gate, a third OR gate, and a fifth multi-input AND gate. A first input terminal of the second OR gate receives the all-bank refresh management refresh request. A second input terminal of the second OR gate receives the all-bank normal refresh request. The fifth multi-input AND gate has a plurality of input terminals configured to receive a plurality of first input signals and perform an AND logic operation. The plurality of first input signals correspond to a plurality of bits of the upper limit value. If any bit in the upper limit value is a high level, a corresponding first input signal is a corresponding bit of the counting result. If any bit in the upper limit value is a low level, a corresponding first input signal is an inverted signal of a corresponding bit of the counting result. A first input terminal of the third OR gate is connected to an output terminal of the second OR gate. A second input terminal of the third OR gate is connected to an output terminal of the fifth multi-input AND gate. An output terminal of the third OR gate is configured to output the reset signal.

In some embodiments, the preset range is 16 to 20.

In some embodiments, the indication circuit includes: a sixth multi-input AND gate, the sixth multi-input AND gate having a plurality of input terminals configured to respectively receive an inverted signal of the first bit, an inverted signal of the second bit, a signal of the third bit, an inverted signal of the fourth bit, and a signal of the fifth bit in the current counting result; a seventh multi-input AND gate, the seventh multi-input AND gate having a plurality of input terminals configured to respectively receive an inverted signal of the third bit, the inverted signal of the fourth bit, and the signal of the fifth bit in the current counting result; and a fourth OR gate, a first input terminal of the fourth OR gate being connected to an output terminal of the sixth multi-input AND gate, a second input terminal of the fourth OR gate being connected to an output terminal of the seventh multi-input AND gate, and an output terminal of the fourth OR gate being configured to output the indication signal.

According to some embodiments, in a second aspect of this application, a memory is provided. The memory includes a row hammer refresh operation module and the refresh control circuit as described in the foregoing examples. The row hammer refresh operation module is connected to the refresh control circuit, and is configured to perform a row hammer refresh in response to a same-bank refresh management refresh request output by the refresh control circuit.

The refresh control circuit provided in the embodiments of this application includes a control circuit, a counter circuit, and an indication circuit. When the refresh management feature is disabled, the control circuit determines, according to whether the indication signal is valid, whether to perform a normal refresh or an RFM refresh. Whether the indication signal is valid is determined by the indication circuit based on the counting result of the counter circuit for the accumulative quantity of same-bank normal refresh requests and same-bank refresh management refresh requests that are continuously output. In the foregoing solution, when the refresh management feature is disabled, the refresh request of a corresponding type is output based on the received address command signal and according to a state of the indication signal, so that an RH protection operation can still be implemented when the refresh management feature is disabled.

BRIEF DESCRIPTION OF THE DRAWINGS

The accompanying drawings herein, which are incorporated in and constitute a part of the specification, illustrate embodiments conforming to this application, and are used together with the specification to explain the principles of embodiments of this application.

The foregoing accompanying drawings already show clear embodiments of this application, which are described in more detail below. These accompanying drawings and text descriptions are not intended to limit the scope of the concept of this application in any manner, but to describe the concept of this application for a person skilled in the art with reference to specific embodiments.

DETAILED DESCRIPTION

Example embodiments are described herein in detail, and examples thereof are shown in the accompanying drawings. When the following descriptions relate to the accompanying drawings, unless otherwise indicated, the same numbers in different accompanying drawings represent the same or similar elements. Implementations described in the following example embodiments do not represent all implementations consistent with this application. On the contrary, they are merely examples of apparatuses and methods that are consistent with some aspects of this application.

The terms "include" and "have" in this application are utilized to denote an open-ended inclusion, and indicate that other elements/components/etc. can be present in addition to the elements/components/etc. listed. The terms "first", "second", and the like are utilized only for labeling or distinguishing purposes, and do not limit the sequence or the quantity of objects thereof. In addition, different elements and regions in the accompanying drawings are merely shown schematically. Therefore, this application is not limited to a size or a distance shown in the accompanying drawings.

The technical solutions are described below in detail through specific embodiments. The following several specific embodiments may be combined with each other. A same or similar concept or process may not be described in some embodiments. The embodiments of this application are described below with reference to the accompanying drawings.

The technical solutions are described below in detail through specific embodiments. The following several specific embodiments may be combined with each other. A same or similar concept or process may not be described in some embodiments. The embodiments of the present disclosure are described below with reference to the accompanying drawings.

Figure 1:
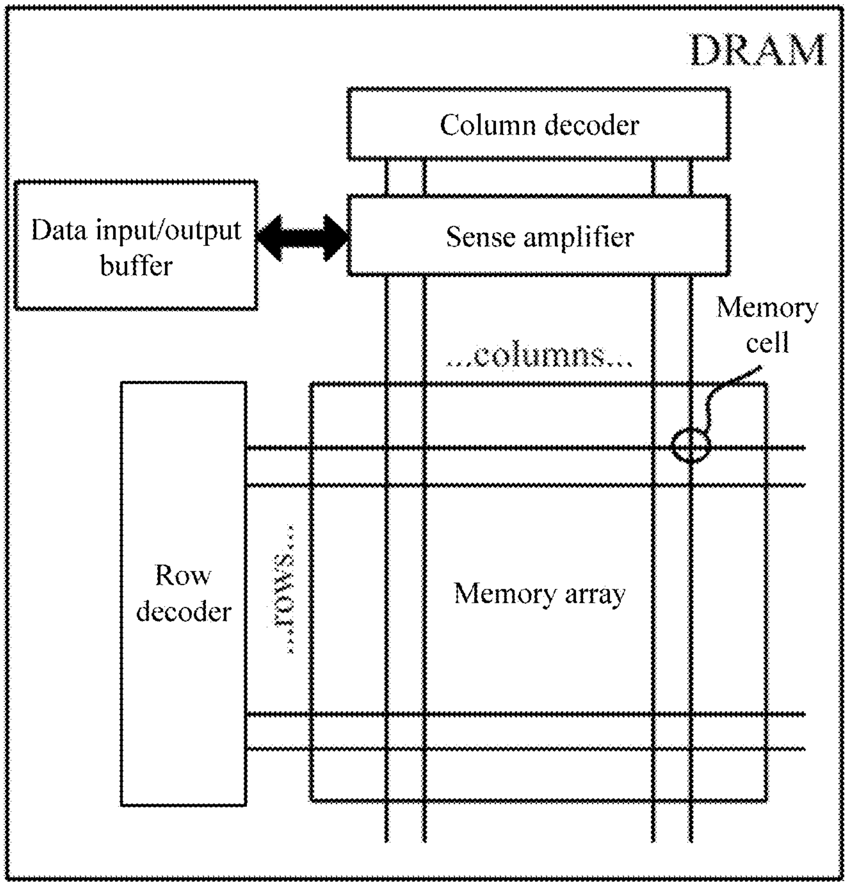
FIG. 1 is an example diagram of an architecture of a memory according to an embodiment.

FIG. 1 is an example diagram of an architecture of a memory according to an embodiment. As shown in FIG. 1, a DRAM is used as an example. The DRAM includes a data input/output buffer, a row decoder, a column decoder, a sense amplifier, and a memory array. The data input/output buffer is a peripheral region circuit, and the sense amplifier, the row decoder, the column decoder, and the memory array are array region circuits. The memory array mainly includes a word line, a bit line, and a memory cell. The word line in the memory array extends in a row direction, the bit line in the memory array extends in a column direction, and the memory cell of the memory array is at a position at which the word line intersects with the bit line.

Figure 2:
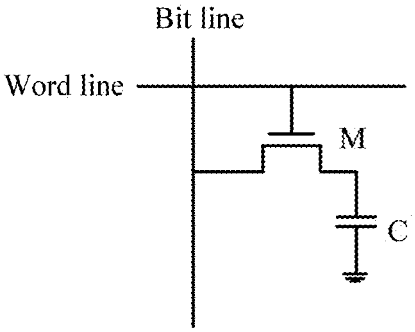
FIG. 2 is an example diagram of a structure of a memory cell according to an embodiment.

Each memory cell is configured to store data of one bit. As shown in FIG. 2. FIG. 2 is an example diagram of a structure of a memory cell according to an embodiment. The memory cell mainly includes a transistor switch M and a capacitor C. The capacitor is configured to store data, and the transistor switch is configured to turn off or on according to a selected state.

A specific memory cell may be activated by controlling a word line and a bit line, to implement access to the memory cell. With reference to an example read scenario, when data in the memory cell needs to be read, a word line of a row in which the memory cell is located may be selected by using the row decoder. Correspondingly, the transistor switch M in the figure is turned on, and a state on the capacitor C in this case may be sensed by sensing and amplifying a bit line signal. For example, if bit data stored in the memory cell is 1, 1 is read from a bit line of the memory cell after the transistor switch M is turned on, and vice versa. In addition, with reference to an example write scenario, when bit data needs to be written to a specific memory cell, for example, 1 is written. A word line of a row in which the memory cell is located may be selected by using the row decoder. Correspondingly, the transistor switch M in the figure is turned on, and a logic level of a bit line is set to 1, so that the capacitor C is charged, that is, 1 is written to the memory cell. On the contrary, if 0 is to be written, the logic level of the bit line is set to 0, so that the capacitor C is discharged, that is, 0 is written to the memory cell.

With reference to the foregoing description, it can be learned that when a processor needs to read data from the memory, a row address in which the data is located is first activated, a row of data under the row address is read into the sense amplifier, a column address in which the data is located is activated, and the data under the column address is read out from the sense amplifier and is fed back to the processor. In addition, to ensure that the data is not lost due to data readout, the data in the sense amplifier further needs to be written back to the memory cell after the data is read. In recent years, with a higher requirement for computer storage in production and life, a device manufacturer hopes to store more data without changing an area of a circuit board. Therefore, density of memory cells can only be designed to be increasingly large, and a spacing between adjacent memory cells is increasing small, resulting in mutual interference therebetween. For example, if reading/writing for a same address is performed for enough times, a bit of an adjacent row may be flipped, that is, 0 originally stored becomes 1, or 1 originally stored becomes 0.

Figure 3:
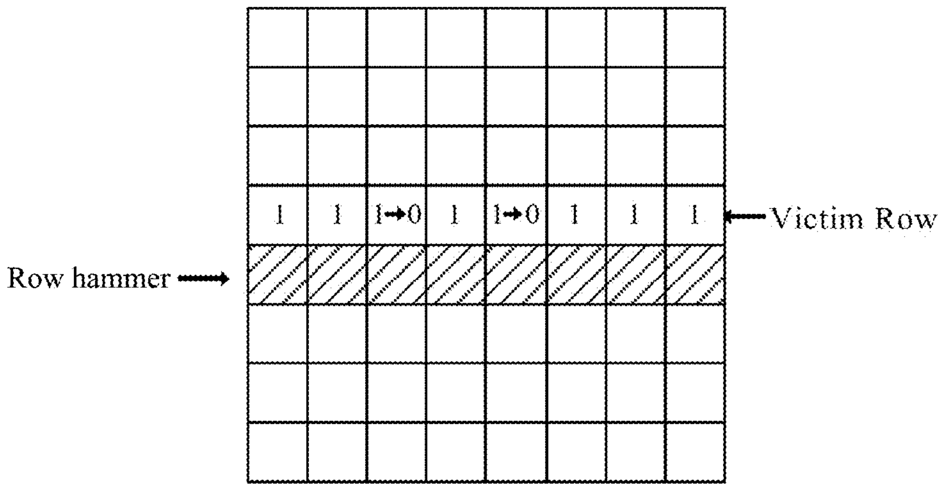
FIG. 3 shows an example case in which row hammer occurs.

Further, with reference to an example in FIG. 3, FIG. 3 shows an example case in which row hammer occurs. As shown in FIG. 3, when an attacker hammers a specific row of the memory, for example, a row filled with shadows in the figure is hammered, data in a memory cell adjacent to the row may be flipped. This is because, with increasingly high manufacturing precision of the DRAM, a component is increasingly small at a physical level, and electromagnetic interference easily occurs between adjacent memory cells. This case causes reading/writing for a single region of the memory to potentially interfere with an adjacent region, leading to a current flowing into or out of an adjacent memory cell. If a large amount of reading/writing is repeatedly performed, it is possible to change data in the adjacent memory cell, for example, a row adjacent to the row filled with shadows in the figure, that is, a victim row, and some data in the adjacent row is flipped, for example, data in the third column and the fifth column is flipped from 1 to 0.

For the above phenomenon, in some example solutions, a specific row hammer protection (RH protection) solution is configured. Specifically, the memory monitors a quantity of times that a specific row is activated, and refreshes a row adjacent to the row when the quantity of times reaches a set quantity value. A double data rate synchronous dynamic random access memory (DDR) is used as an example. To better protect the data and implement RH protection, a refresh management feature (RFM feature) is introduced into DDR5/LPDDR5. In short, when the refresh management feature is enabled, after detecting that a specific bank of the DRAM receives excessive activation commands, a central processing unit (CPU) additionally sends some refresh commands to the DRAM, that is, refresh management refresh requests (RFM refresh requests). Correspondingly, the DRAM performs additional refreshes required by RH protection in response to the refresh management refresh requests, that is, performs refresh management refreshes (RFM refreshes). The refresh management refresh requests are further classified into an all-bank refresh management refresh request (RFM AB) and a same-bank refresh management refresh request (RFM SB). A difference therebetween lies in whether an object to be refreshed is all banks of all bank groups or a specific bank of all bank groups.

In actual application, whether to enable the refresh management feature may be selectively set. However, regardless of whether the refresh management feature is enabled, considering data security and stability, the memory should perform RH protection. Some aspects of the embodiments of this application relate to the foregoing consideration. Example descriptions of the solutions are provided below with reference to some embodiments.

Figure 4:
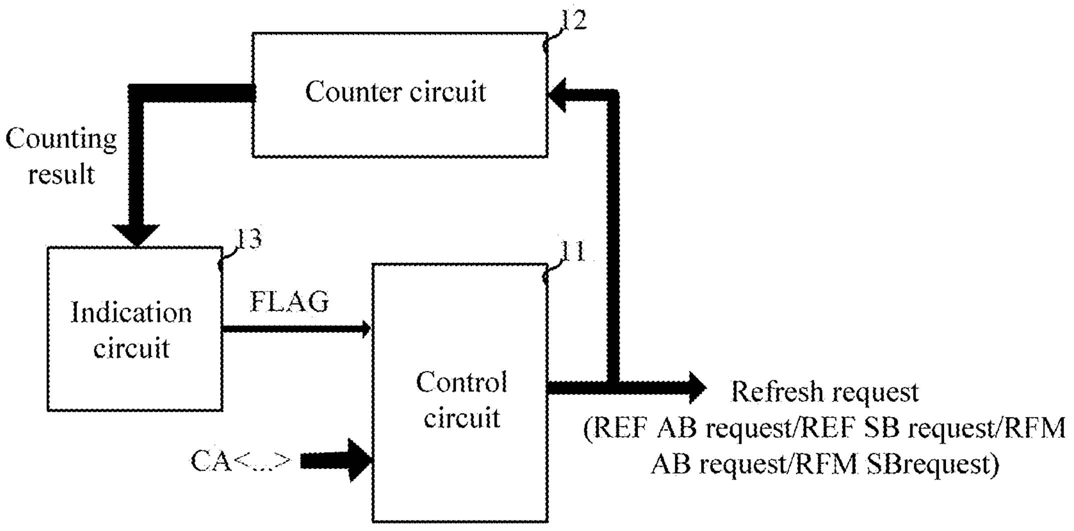
FIG. 4 is a schematic diagram of a structure of an example refresh control circuit.

FIG. 4 is a schematic diagram of a structure of an example refresh control circuit. As shown in FIG. 4, the refresh control circuit includes a control circuit 11, a counter circuit 12, and an indication circuit 13.

The control circuit 11 is connected to an output terminal of the indication circuit 13, and is configured to: when a refresh management feature is disabled, output an all-bank normal refresh request (REF AB request) or a same-bank normal refresh request (REF SB request) according to a received address command signal CA< . . . > if the indication circuit 13 currently outputs an invalid indication signal FLAG, or output an all-bank refresh management refresh request (RFM AB request) or a same-bank refresh management refresh request (RFM SB request) according to a received address command signal CA< . . . > if the indication circuit 13 currently outputs a valid indication signal FLAG.

The counter circuit 12 is connected to an output terminal of the control circuit 11, and is configured to count an accumulative quantity of REF SB requests and RFM SB requests that are continuously output by the control circuit 11, output a counting result, and perform resetting and start counting again in response to the current counting result reaching a set upper limit value or when the control circuit 11 outputs the REF AB request or the RFM AB request.

The indication circuit 13 is connected to an output terminal of the counter circuit 12, and is configured to output the valid indication signal FLAG if the current counting result is in a preset range, or output the invalid indication signal FLAG if the current counting result is not in a preset range.

In actual application, the circuit provided in this embodiment may be applied to various memories, for example, may be applied to, including but not limited to, a double data rate synchronous dynamic random access memory (DDR).

An REF request is configured to request the memory to perform a normal refresh. The normal refresh described herein includes a refresh required by the memory to implement normal retention of data. Specifically, with reference to the operating principle of the foregoing memory, it can be learned that data storage is actually implemented by storing a specific charge by using the capacitor in the memory cell. For example, if there is a charge on the capacitor, it indicates that stored data is 1, or if there is no charge, it indicates that stored data is 0. In actual application, because the charge on the capacitor is lost over time, to retain the stored data, the following setting may be made: Capacitors in memory cells in the memory are supplied with charges at an interval of a period of time, so that the charges on the capacitors are maintained in states corresponding to data stored in the memory cells. This process is referred to as a normal refresh. A specific processing process of the normal refresh includes reading and rewriting the stored data.

According to different refresh granularities, the REF refresh further includes an REF AB refresh and an REF SB refresh. Similarly, a difference therebetween lies in whether an object to be normally refreshed is all banks of all bank groups or a specific bank of all bank groups. It can be learned that a granularity of a same-bank refresh, for example, a same-bank normal refresh and a same-bank refresh management refresh, is less than that of an all-bank refresh, for example, an all-bank normal refresh and an all-bank refresh management refresh.

With reference to an example scenario, when the refresh management feature (RFM) is disabled, the memory first performs the normal refresh, that is, the control circuit 11 outputs the REF AB request or the REF SB request according to the address command signal CA< . . . >. In addition, the counter circuit 12 counts a quantity of REF SB refreshes that are continuously performed. When the quantity of REF SB refreshes that are continuously performed is in the preset range, the indication circuit 13 outputs the valid indication signal FLAG. Correspondingly, when the indication signal FLAG is valid, the control circuit 11 outputs the RFM AB request or the RFM SB request according to the address command signal CA< . . . >. In addition, based on the counting result of the REF SB refreshes that are continuously performed previously, the counter circuit 12 continues to accumulate a quantity of RFM SB refreshes that are continuously performed, and resets to 0 when the counting result reaches the set upper limit value. Correspondingly, the indication circuit 13 outputs the invalid indication signal FLAG, and the memory performs the normal refresh again.

With reference to the foregoing solution, an RFM SB refresh frequency may be flexibly adjusted when the refresh management feature is disabled. For example, one group of same-bank refresh management refreshes is performed after every four groups of same-bank normal refreshes. A start value of the preset range may be set to a sum of quantities of the four groups of same-bank normal refreshes. For example, each group of same-bank normal refreshes includes four same-bank normal refreshes. It can be learned that a total refresh quantity of the four groups of same-bank normal refreshes is 16, and the start value of the preset range may be set to 16. An end value of the preset range may be set according to a refresh quantity of each group of same-bank refresh management refreshes. For example, each group of same-bank refresh management refreshes is also set to include four same-bank refresh management refreshes, and the end value of the preset range may be set to 20. That is, in an example, the preset range is 16 to 20. Correspondingly, the indication circuit 13 outputs the valid indication signal when the counting result is 16 to 20. Further, the upper limit value may be further set as required, to reset the counting result and control the counter circuit 12 to enter a next round of counting after the same-bank refresh management refresh is performed. Correspondingly, the indication circuit 13 outputs the invalid indication signal again, and the memory performs the all-bank or same-bank normal refresh according to the received address command signal. With reference to the foregoing example, the upper limit value may be set to 20.

With reference to the foregoing solution, when the refresh management feature is disabled, the RFM SB refresh may be performed in a timely manner based on an actual refresh condition of the memory and according to an RH protection frequency that can be flexibly adjusted, so that RH protection can still be effectively implemented in a timely manner when the refresh management feature is disabled. In addition, in the solution of this embodiment, a circuit originally configured to generate the RFM SB request is used ingeniously. When the RFM feature is disabled, the circuit is reused to generate the refresh request for RH protection, that is, a set of RH control circuits may be shared for REF SB and RFM SB, and there is no need to design a dedicated circuit for RH protection. Therefore, design difficulty and complexity of RH are further greatly simplified, and a circuit area is reduced.

In another case, when the refresh management feature is enabled, the refresh control circuit may alternatively parse the address command signal in response to the address command signal sent by the processor, and perform a corresponding refresh. That is, in an example, the control circuit 11 is further configured to output an REF AB request, an REF SB request, an RFM AB request, or an RFM SB request according to a received address command signal CA<. . . > when the refresh management feature is enabled.

The address command signal includes a first address command and a second address command, different level states of the first address command respectively represent a normal refresh type and a refresh management refresh type, and different level states of the second address command respectively represent an all-bank refresh type and a same-bank refresh type.

In an example, the first address command is CA9, and the second address command is CA10. For example, a mapping relationship between an address command and a refresh type is shown in Table 1. Table 1 shows address command examples corresponding to different refresh types, where H represents a high level, L represents a low level, V represents any value, and RIR, that is, refresh interval rate indicator, is configured to indicate that whether REF CMD is sent at a frequency once or twice a normal frequency. For other parameter values, refer to a related technology. Refer to Table 1. When a refresh needs to be performed, a chip select (CS) signal is in a low level state (L) and states of address commands CA0 to CA5 are shown in Table 1, it represents that the refresh needs to be performed. CA9 and CA10 are configured to indicate refresh types, the different level states of CA9 are configured to indicate whether a current refresh is a normal refresh or a refresh management refresh, and the different level states of CA10 are configured to indicate whether a current refresh is an all-bank refresh or a same-bank refresh. In an example, with reference to the examples in the following table, the following settings may be made: If CA9 is at a low level, it represents that the RFM refresh is performed, or if CA9 is not at a low level, it represents that the REF refresh is performed. If CA10 is at a low level, it represents that the all-bank refresh is performed, or if the CA10 is at a high level, it represents that the same-bank refresh is performed. Therefore, a refresh type of the current refresh may be determined based on states of CA9 and CA10 in the currently received address command signal. For example, when CA9 is at the low level and CA10 is at the high level, it represents that a type of the current refresh is the same-bank RFM refresh. In addition, as shown in Table 1, CA6 and CA7 are configured to indicate a bank that requires the same-bank refresh (for example, the RFM SB refresh or the REF SB refresh). With reference to the examples in the following table, it is assumed that the high level means valid, and when CA6 is at a high level and CA7 is at a low level in the received address command signal, it represents that the bank that requires the same-bank refresh is BAO. A signal of CA8 may be any value.

TABLE 1

| | | CA Pins | | | | | | | | | | | | | | |
|---|---|---|---|---|---|---|---|---|---|---|---|---|---|---|---|---|
| Function | Abbreviation | CS_n | CA0 | CA1 | CA2 | CA3 | CA4 | CA5 | CA6 | CA7 | CA8 | CA9 | CA10 | CA11 | CA12 | CA13 |
| Refresh All | REFab | L | H | H | L | L | H | CID3 | V | V | V or RIR | V or H | L | CID0 | CID1 | CID2 |
| Refresh Management All | RFMab | L | H | H | L | L | H | CID3 | V | V | V | L | L | CID0 | CID1 | CID2 |
| Refresh Same Bank | REFsb | L | H | H | L | L | H | CID3 | BA0 | BA1 | V or RIR | V or H | H | CID0 | CID1 | CID2 |
| Refresh Management Same Bank | RFMsb | L | H | H | L | L | H | CID3 | BA0 | BA1 | V | L | H | CID0 | CID1 | CID2 |

A specific refresh type can be determined by parsing the address command signal, to output a corresponding refresh request, so that the memory performs a refresh of a corresponding type in response to an instruction delivered by the processor when the refresh management feature is enabled, thereby implementing RH protection when the refresh management feature is enabled.

Figure 5:
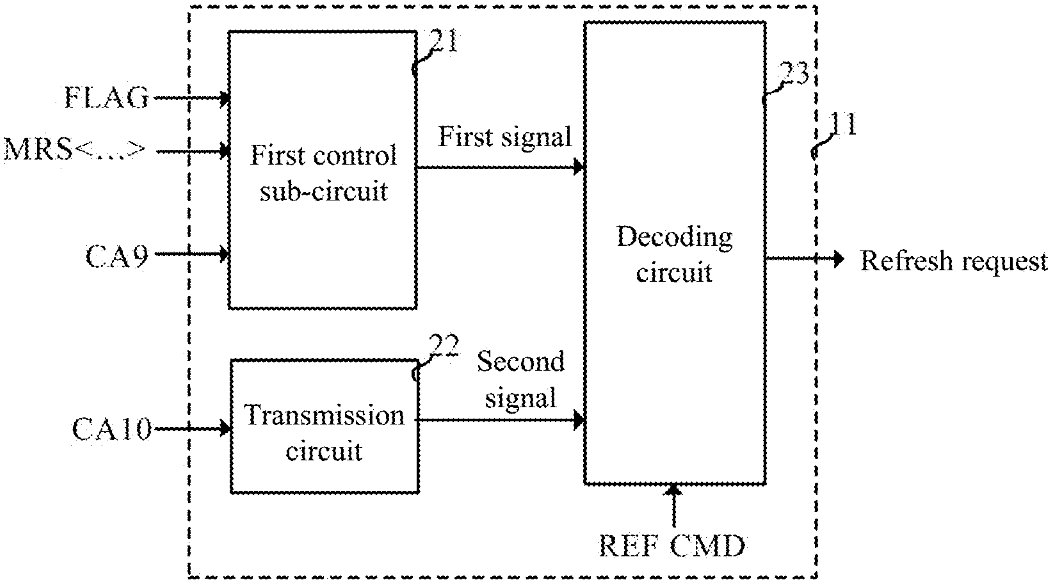
FIG. 5 is an example diagram of a structure of an example control circuit.

The control circuit outputs, in response to the address command signal, a refresh request of a corresponding type according to whether the current refresh management feature is enabled and whether the indication signal is valid. A specific implementation circuit of the control circuit is not limited. In an example, FIG. 5 is an example diagram of a structure of an example control circuit. As shown in FIG. 5, the control circuit 11 includes:

a first control sub-circuit 21, configured to receive a mode register instruction MRS< . . . >, the first address command CA9, and the indication signal FLAG to detect whether the refresh management feature is enabled according to the mode register instruction MRS< . . . > and output a first signal with reference to the first address command CA9 and the indication signal FLAG, a first signal consistent with the first address command CA9 being output if the refresh management feature is enabled, or if the refresh management feature is disabled, a first signal representing the normal refresh type being output in response to the currently invalid indication signal FLAG, and a first signal representing the refresh management refresh type being output in response to the currently valid indication signal FLAG;

a transmission circuit 22, configured to receive the second address command CA10 to output the second address command CA10 as a second signal after delaying the second address command CA10 by predetermined duration; and a decoding circuit 23, connected to the first control sub-circuit 21 and the transmission circuit 22, and configured to receive the first signal and the second signal, and output a refresh request of a corresponding type according to level states of the first signal and the second signal in response to a refresh command REF CMD.

Refresh requests include but are not limited to the REF AB request, the REF SB request, the RFM AB request, and the RFM SB request. It should be noted that, in the figure, that the first address command is CA9 and the second address command is CA10 is used as an example. This is merely an example. In actual application, the first address command and the second address command may be determined according to a type and a model of the memory, and may alternatively be other address command signals. Whether the refresh management feature is enabled may be determined by reading data in a mode register. For example, different values may be defined in a mode register MRS58<0> to represent whether the refresh management feature is enabled. In actual application, whether the refresh management feature is enabled may be preset by a memory manufacturer. For example, 0 may be written to MRS58<0> when the refresh management feature is disabled, and 1 may be written to MRS58<0> when the refresh management feature is enabled. Subsequently, the first control sub-circuit 21 may determine, according to data read from MRS58<0>, whether the refresh management feature is enabled.

It can be understood that the memory performs, when the refresh management feature is enabled, the RFM refresh in response to an RFM command sent by the processor, to implement RH protection. Therefore, the first control sub-circuit 21 may directly transmit the received first address command to the decoding circuit 23 for decoding. Specifically, in this example, the first control sub-circuit 21 outputs, when the refresh management feature is enabled, the first signal whose level state is consistent with the level state of the first address command. That is, "consistent" in the specification means that level states are consistent, and does not restrict the signal to be completely the same in a time sequence, because a delay generated during signal generation and transmission further needs to be considered in actual application. With reference to a structure in FIG. 5, when the refresh management feature is enabled, the output first signal is a high level signal if CA9 received by the first control sub-circuit 21 is at the high level, otherwise, the first signal is a low level signal. In this case, the first control sub-circuit 21 essentially plays a role of signal transmission. When the refresh management feature is disabled, the processor does not indicate, to the memory, the RFM refresh required by RH protection. Therefore, the first control sub-circuit 21 outputs the first signal according to whether the indication signal FLAG generated by the indication circuit 13 based on the counting result of the counter circuit 12 is valid. Specifically, when the RFM refresh does not need to be performed, the indication signal FLAG is in an invalid state, and the first control sub-circuit 21 outputs the first signal representing the normal refresh type. For example, in this case, the level state of the first signal is a high level. However, when the RFM refresh needs to be performed, the indication circuit 13 outputs the valid indication signal FLAG. Correspondingly, the first control sub-circuit 21 outputs, in response to the valid indication signal FLAG, the first signal representing the refresh management refresh type. For example, in this case, the level state of the first signal is a low level. That is, a current normal refresh is replaced with a refresh management refresh through the foregoing operation, so that the decoding circuit outputs the RFM refresh request based on the first signal, thereby implementing RH protection when the refresh management feature is disabled.

Specifically, the second address command is configured to represent whether the object to be refreshed is all banks or a same bank, and whether the current refresh is the normal refresh or the refresh management refresh is not affected. Therefore, the transmission circuit 22 only needs to transmit the second address command to the decoding circuit 23. Considering time sequence matching between the first signal and the second signal, the transmission circuit is disposed on a transmission path of the second signal, to output the second address command to the decoding circuit 23 as the second signal after delaying the second address command by specific duration. For example, a delay parameter of the transmission circuit may be determined according to a time sequence delay between the first signal and the first address command, to match a time sequence between the first signal and the second signal, thereby preventing the decoding circuit from outputting an incorrect decoding result due to a mismatched time sequence between the input signals subsequently, thereby improving accuracy of refresh control.

Figure 6:
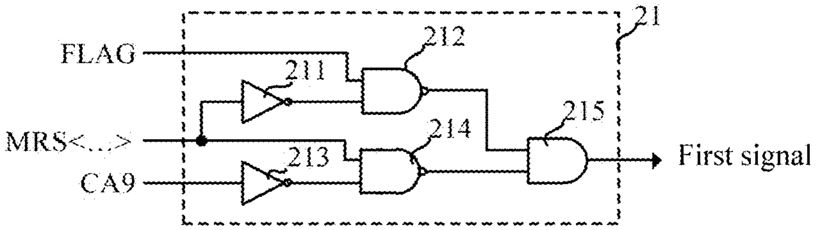
FIG. 6 is an example diagram of a structure of an example first control sub-circuit.

Implementation circuits of the first control sub-circuit, the transmission circuit, and the decoding circuit are not limited. For example, FIG. 6 is an example diagram of a structure of an example first control sub-circuit. As shown in FIG. 6, the first control sub-circuit 21 includes a first NOT gate 211, a first NAND gate 212, a second NOT gate 213, a second NAND gate 214, and a first AND gate 215.

A first input terminal of the first NAND gate 212 receives the indication signal FLAG. An input terminal of the first NOT gate 211 receives the mode register instruction MRS< . . . >. An output terminal of the first NOT gate 211 is connected to a second input terminal of the first NAND gate 212. An output terminal of the first NAND gate 212 is connected to a first input terminal of the first AND gate 215.

A first input terminal of the second NAND gate 214 receives the mode register instruction MRS< . . . >. An input terminal of the second NOT gate 213 receives the first address command CA9. An output terminal of the second NOT gate 213 is connected to a second input terminal of the second NAND gate 214. An output terminal of the second NAND gate 214 is connected to a second input terminal of the first AND gate 215.

An output terminal of the first AND gate 215 is configured to output the first signal. The refresh management feature is enabled when the mode register instruction MRS< . . . > is at a high level. The refresh management feature is disabled when the mode register instruction MRS< . . . > is at a low level. The indication signal is valid when the indication signal FLAG is at a high level, and the indication signal is invalid when the indication signal FLAG is at a low level.

Specifically, the first control sub-circuit 21 plays a role of transmission when the refresh management feature is enabled, that is, outputs the first signal whose level state is consistent with that of the first address command. When the refresh management feature is disabled, the first signal whose level state represents the normal refresh type is output if the indication signal is invalid, or the first signal whose level state represents the refresh management refresh type is output if the indication signal is valid.

With reference to a structure in FIG. 6, when the refresh management feature is enabled, that is, MRS< . . . > is 1, MRS< . . . > reaches the second input terminal of the first NAND gate 212 after being inverted (the level state is 0) by the first NOT gate 211. Because an input of the second input terminal of the first NAND gate 212 is 0, an input signal of the first input terminal, that is, the indication signal, is shielded. Regardless of whether the level state of the indication signal is 1 or 0, the first NAND gate 212 outputs 1, that is, in this case, the first input terminal of the first AND gate is 1, and the level state of the first signal depends on a level state at the second input terminal of the first AND gate. In this case, the refresh management feature is enabled, and MRS< . . . > is 1, that is, there is 1 at the first input terminal of the second NAND gate 214. Therefore, a level state at the first input terminal of the second NAND gate 214, that is, the level state of the first address command CA9, may be reflected to an output of the second NAND gate. For example, if the first address command is 1, 0 is obtained after the first address command is negated by the second NOT gate 213, there is 0 at the second input terminal of the second NAND gate 214, and the first signal output after the second NAND gate 214 performs an NAND operation is 1, which is consistent with the first address command CA9 in terms of level state. On the contrary, if the first address command CA9 is 0, 1 is obtained after the first address command is negated by the second NOT gate 213, there is 1 at the second input terminal of the second NAND gate 214, and the first signal output after the second NAND gate 214 performs an NAND operation is 0, which is still consistent with the first address command CA9 in terms of level state.

Still with reference to the structure in FIG. 6, when the refresh management feature is disabled, that is, MRS< . . . > is 0, MRS< . . . > reaches the second input terminal of the first NAND gate 212 after being inverted (the level state is 1) by the first NOT gate 211. Because an input of the second input terminal of the first NAND gate 212 is 1, an input signal of the first input terminal, that is, the level state of the indication signal FLAG, may be reflected to an output of the first NAND gate 212. For example, if the indication signal is invalid (is 0), there is 0 at the first input terminal of the first NAND gate 212, and the first NAND gate 212 outputs 1 after performing an NAND operation. A signal at the first input terminal of the second NAND gate 214, that is, an MRS< . . . > signal, is 0. Therefore, the second NAND gate 214 outputs 1. Correspondingly, the first AND gate 215 performs an AND operation on the input signal to output the first signal as 1. It should be noted that, in the foregoing example, although the first address command is shielded at the second NAND gate 214, it can be understood that refreshes indicated by the processor are all normal refreshes when the refresh management feature is disabled. Therefore, with reference to the foregoing examples in Table 1, it can be learned that the first address command is not 0, for example, 1. Therefore, the first AND gate 215 outputs the first signal as 1, and the level states of the first address command and the first signal are consistent. For another example, if the indication signal is valid (is 1), there is 1 at the first input terminal of the first NAND gate 212, MRS< . . . > is 1 after being inverted by the first NOT gate 211, that is, there is 1 at the second input terminal of the first NAND gate 212, the first NAND gate 212 outputs 0 after performing an NAND operation, and 0 reaches the first input terminal of the first AND gate 215. In this case, a signal at the second input terminal of the first AND gate 215, that is, a signal output by the second NAND gate 214 is shielded, and the first AND gate 215 outputs 0, which represents the refresh management refresh type. It should be noted that, when performing decoding based on the first signal and the second signal, the decoding circuit 23 may perform decoding with reference to a mapping relationship between a refresh type and both of the first address command and the second address command, for example, with reference to Table 1. That is, in this example, when the refresh management feature is disabled and the indication signal is valid, the level state of the first address command is input to the decoding circuit after being modified and replaced, so that a modified and replaced signal represents the refresh management refresh. Correspondingly, the decoding circuit outputs a refresh request of the RFM type to implement RH protection. In the solution of this embodiment, a circuit that generates the RFM SB request is reused to generate, when the RFM feature is disabled, the refresh request used for RH protection, and there is no need to design a dedicated circuit for RH protection. Therefore, design difficulty and complexity of RH are further greatly simplified, and a circuit area is reduced.

Figure 7:
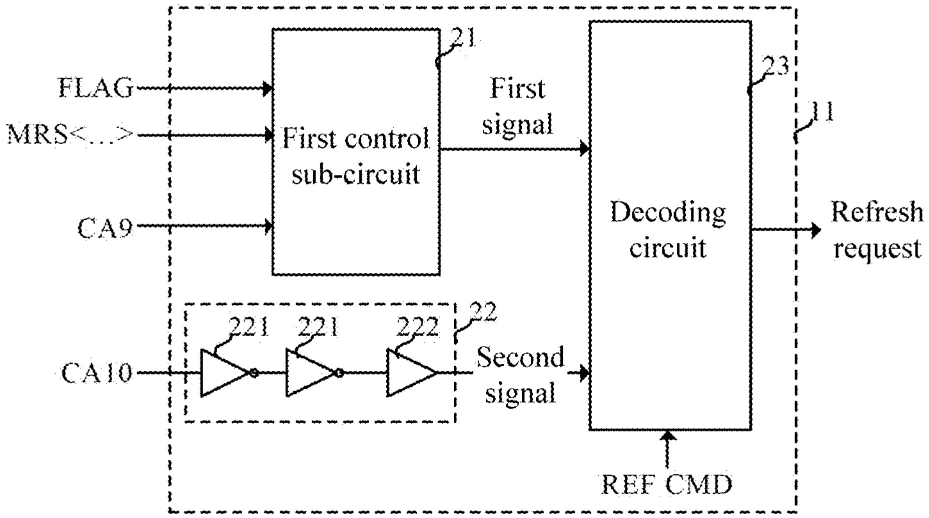
FIG. 7 is an example diagram of a structure of an example control circuit.

Specifically, the transmission circuit 22 transmits the second address command to the decoding circuit as the second signal after delaying the second address command, to match the time sequence between the first signal and the second signal. In an example, FIG. 7 is an example diagram of a structure of an example control circuit. As shown in FIG. 7, the transmission circuit 22 includes an even number of third NOT gates 221 and a first buffer 222 that are sequentially connected in series. An input terminal of a first third NOT gate 221 receives the second address command CA10. An output terminal of a last third NOT gate 221 is connected to an input terminal of the first buffer 222. An output terminal of the first buffer 222 is configured to output the second signal. A quantity of third NOT gates may be determined according to a required delay. In the figure, for example, two third NOT gates are included. In this example, the transmission circuit includes NOT gates and a buffer, to implement time sequence matching between the first signal and the second signal. In addition, the transmission circuit is implemented by using a normal device, thereby further simplifying a circuit and a process, and reducing costs.

Figure 8:
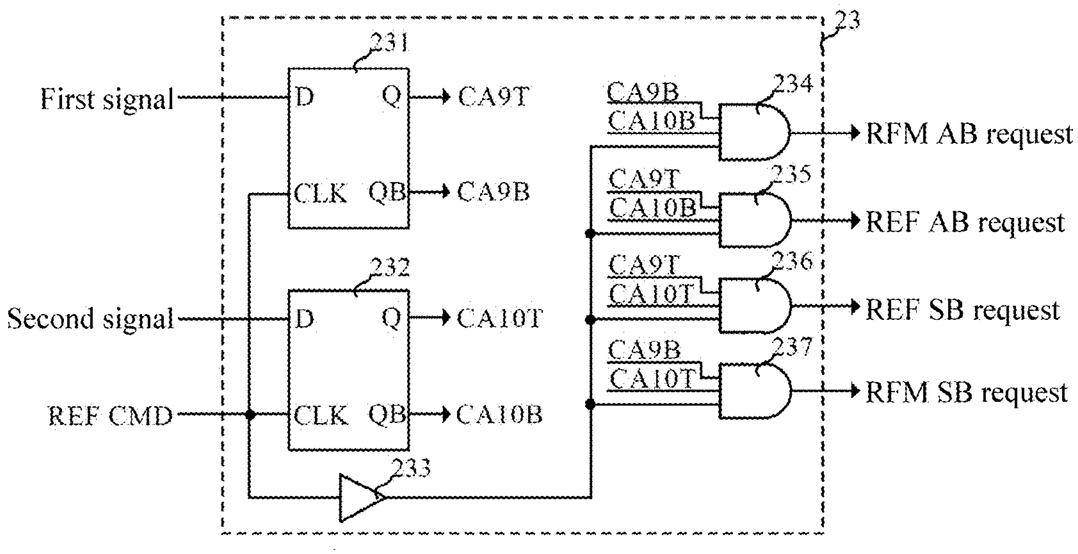
FIG. 8 is an example diagram of a structure of an example decoding circuit.

In an example, FIG. 8 is an example diagram of a structure of an example control circuit. As shown in FIG. 8, the decoding circuit 23 includes:

- a first flip-flop 231, an input terminal of the first flip-flop 231 receiving the first signal, an in-phase output terminal of the first flip-flop 231 being configured to output a first sub-signal CA9T, an inverting output terminal of the first flip-flop 231 being configured to output a second sub-signal CA9B, and a clock terminal of the first flip-flop 231 receiving the refresh command REF CMD;
- a second flip-flop 232, an input terminal of the second flip-flop 232 receiving the second signal, an in-phase output terminal of the second flip-flop 232 being configured to output a third sub-signal CA10T, an inverting output terminal of the second flip-flop 232 being configured to output a fourth sub-signal CA10B, and a clock terminal of the second flip-flop receiving the refresh command REF CMD;
- a second buffer 233, an input terminal of the second buffer 233 receiving the refresh command REF CMD, and the second buffer 233 being configured to output the refresh command REF CMD after delaying the refresh command REF CMD;
- a first multi-input AND gate 234, an input terminal of the first multi-input AND gate 234 being separately connected to the second sub-signal CA9B, the fourth sub-signal CA10B, and an output terminal of the second buffer 233, and the first multi-input AND gate 234 being configured to output the RFM AB request;
- a second multi-input AND gate 235, an input terminal of the second multi-input AND gate 235 being separately connected to the first sub-signal CA9T, the fourth sub-signal CA10B, and the output terminal of the second buffer 233, and the second multi-input AND gate 235 being configured to output the REF AB request;
- a third multi-input AND gate 236, an input terminal of the third multi-input AND gate 236 being separately connected to the first sub-signal CA9T, the third sub-signal CA10T, and the output terminal of the second buffer 233, and the third multi-input AND gate 236 being configured to output the REF SB request; and
- a fourth multi-input AND gate 237, an input terminal of the fourth multi-input AND gate 237 being separately connected to the second sub-signal CA9B, the third sub-signal CA10T, and the output terminal of the second buffer 233, and the fourth multi-input AND gate 236 being configured to output the RFM SB request.

Specifically, in the figure, that the first address command is CA9 and the second address command is CA10 is used as an example. In this example, corresponding multi-input AND gates are disposed for various refresh types, for example, the first multi-input AND gate corresponds to the RFM AB refresh, the second multi-input AND gate corresponds to the REF AB refresh, the third multi-input AND gate corresponds to the REF SB refresh, and the fourth multi-input AND gate corresponds to the RFM SB refresh. An input of each multi-input AND gate may be determined according to a signal level state corresponding to a refresh type corresponding to the multi-input AND gate, and the signal level state may be determined with reference to the mapping relationships shown in Table 1. For example, a signal representing the RFM AB refresh (including CA9 and CA10 in Table 1) is 00, a signal representing the REF AB refresh is 10, a signal representing the REF SB refresh is 11, and a signal representing the RFM SB refresh is 01. The decoding circuit 23 outputs a corresponding refresh request according to a signal including the current first signal and second signal. For example, when the first signal is 1 and the second signal is 0, the first sub-signal is 1, the second sub-signal is 0, the third sub-signal is 0, and the fourth sub-signal is 1. Correspondingly, input signals of the first multi-input AND gate are the second sub-signal and the fourth sub-signal, that is, 0 and 1, and the first multi-input AND gate outputs 0 after performing an AND operation, to represent that the current refresh is not the all-bank refresh management refresh request RFM AB; and input signals of the second multi-input AND gate include the first sub-signal and the fourth sub-signal, that is, 1 and 1, and the second multi-input AND gate outputs 1 after performing an AND operation, to represent that a valid all-bank normal refresh request REF AB is output.

A delay parameter of the second buffer 233 may be determined based on a delay of the first flip-flop 231 and a delay of the second flip-flop 232, to match a time sequence between signals input to the multi-input AND gates, thereby avoiding an output error caused by time sequence misalignment. It should be noted that the decoding circuit operates in response to the refresh command, that is, the decoding circuit samples information about the first signal and the second signal in response to the refresh command, and transmits sampled information and the refresh command obtained after delay matching to the multi-input AND gates for operations, thereby avoiding a decoding error caused by inconsistent time sequences.

In this example, the decoding circuit includes flip-flops, a buffer, and multi-input AND gates, so that a corresponding refresh request is accurately output according to the first signal and the second signal, thereby implementing RH protection. In addition, the decoding circuit is implemented by using a normal device, thereby further simplifying a circuit and a process, and reducing costs.

Specifically, the indication signal is configured to indicate whether the control circuit performs the RFM refresh when the refresh management feature is disabled. That is, an RFM refresh frequency is determined based on an occurrence frequency of the valid indication signal, and a quantity of RFM refreshes continuously performed each time is determined based on a valid period window length of a single indication signal. For example, in actual application, the type and a standard of the memory are considered. For example, based on a related standard, every four RFM SB refresh requests are defined as one group, and all banks of the memory are refreshed by outputting groups of requests, to complete one time of RFM SB refresh for the memory. Therefore, to ensure a rule and integrity of a command, the quantity of RFM refreshes continuously performed each time is set to 4, and one group of refreshes in every five groups of REF SB refreshes is replaced with RFM SB refreshes. In an example, the last group of the five groups of REF SB refreshes is replaced with the RFM SB refreshes, that is, one group of refreshes after every four groups of REF SB refreshes is RFM SB refreshes.

Figure 9:
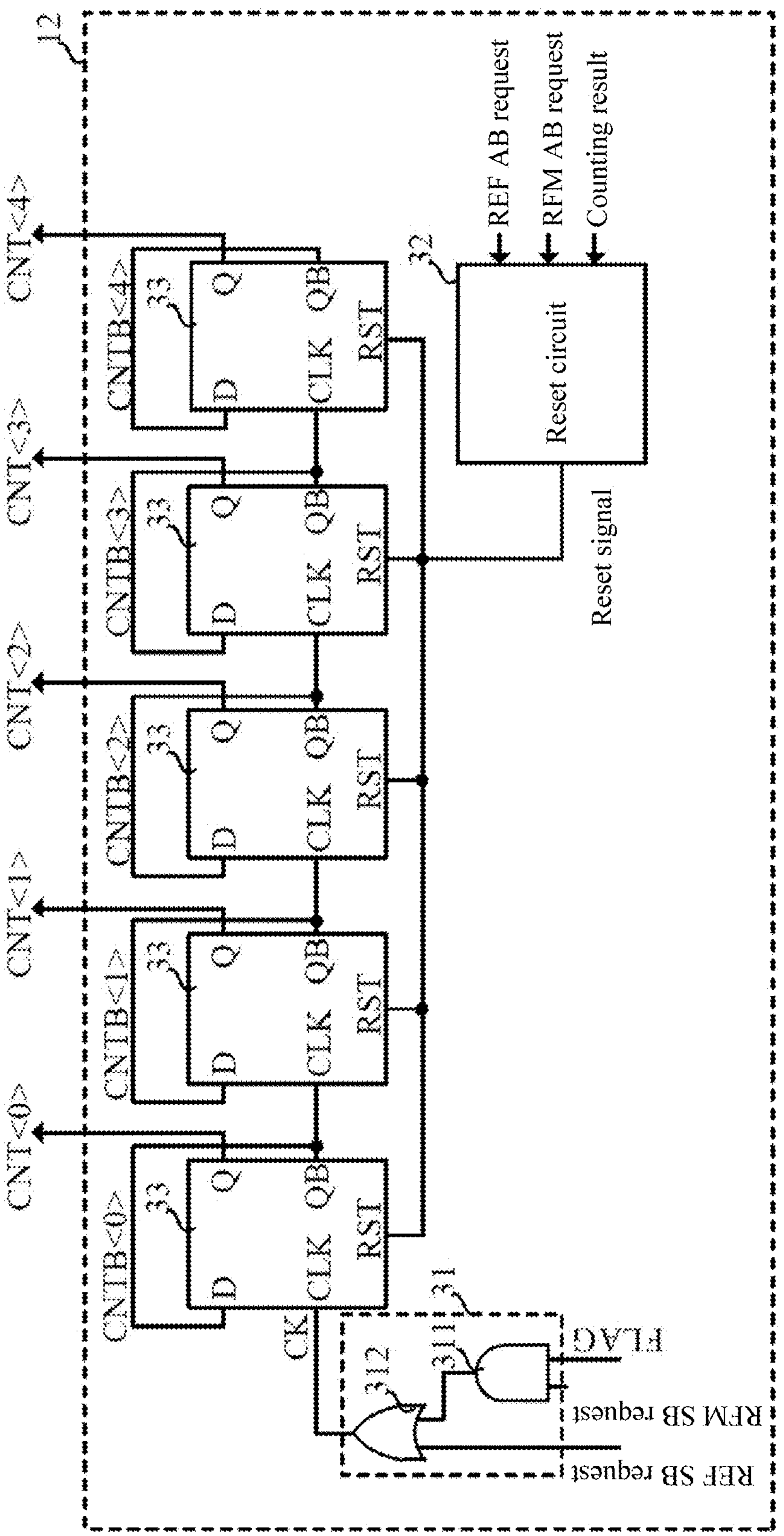
FIG. 9 is an example diagram of a structure of an example counter circuit.

To output the RFM SB request in a timely manner according to a refresh policy, when to switch to the RFM SB request is indicated in a counting manner. In an example, FIG. 9 is an example diagram of a structure of an example counter circuit. As shown in FIG. 9, the counter circuit 12 includes a counting clock circuit 31, a reset circuit 32, and a plurality of stages of third flip-flops 33 corresponding to binary bits.

The counting clock circuit 31 is connected to the control circuit 11, and is configured to output a counting clock CK when the REF SB request is received or the current indication signal FLAG is valid and the RFM SB request is received.

A clock terminal of the first stage of third flip-flop 33 is connected to an output terminal of the counting clock circuit 31. A clock terminal of another third flip-flop 33 is connected to an inverting output terminal of a previous stage of third flip-flop 33. An input terminal of each third flip-flop 33 is connected to an inverting output terminal of the third flip-flop 33. A value CNT< . . . > output by an in-phase output terminal of each stage of third flip-flop 33 constitutes an output of the counter circuit 12. The output is a binary representation of the counting result.

An input terminal of the reset circuit 32 is connected to output terminals of the control circuit 11 and the plurality of stages of third flip-flops 33, and is configured to output a reset signal when the REF AB request or the RFM AB request is received or when the counting result is an upper limit value. An output terminal of the reset circuit 32 is connected to a reset terminal of each stage of third flip-flop 33.

A quantity of third flip-flops 33 may be determined according to the upper limit value for counting. For example, when the upper limit value is 20, a corresponding binary representation includes five bits, and five third flip-flops may be correspondingly disposed. Optionally, six third flip-flops may alternatively be disposed. In the figure, for example, five stages of third flip-flops are disposed. Results output by in-phase output terminals of the third flip-flops are respectively CNT<0> to CNT<4>, which constitute the binary representation of the counting result. Results output by inverting output terminals of the third flip-flops are respectively CNTB<0> to CNTB<4>. Specifically, the counting clock circuit 31 is configured to provide the counting clock CK. To implement the foregoing frequency at which the memory performs the RFM SB refresh and a quantity of requests in each group of RFM SB requests, the counting clock circuit 31 outputs the counting clock only when the REF SB request and the RFM SB request are received, to indicate the third flip-flops to perform accumulative counting. That is, a counting value output by the counting clock circuit 31 reflects a quantity of REF SB refreshes and RFM SB refreshes. With reference to the foregoing content, to ensure integrity of a command CMD, and to ensure that the memory can accurately identify which four REF SB refresh requests are one group of requests, in a counting process, if an all-bank refresh request, for example, the RFM AB request or the REF AB request, is received, counting is interrupted and counting resetting is performed, for example, zeroing.

With reference to the foregoing example in which one group of RFM SB refreshes is performed after every four REF SB refreshes, MRS< . . . > is 0 when the refresh management feature is disabled. With reference to the foregoing example, it can be learned that the first address command is shielded. The normal refresh is first performed at the beginning, for example, the first control sub-circuit 21 continuously outputs 1, and whether all the banks are refreshed or the same bank is refreshed depends on the second address command, that is, the refresh at the beginning may be the REF SB refresh or the REF AB refresh. When the REF SB refresh is not performed, the counting result of the REF SB refresh and the RFM SB refresh is 0 and is not in the range of 16 to 20, and the indication circuit outputs the invalid indication signal, that is, FLAG in this case is 0. If the processor indicates to perform the REF SB refresh, the control circuit 11 may output an REF SB request after decoding the address command signal. Correspondingly, the counting clock circuit 31 outputs one pulse signal as the counting clock CK when the control circuit 11 outputs an REF SB request, and the third flip-flops perform counting. By analogy, the indication circuit 13 starts to output the valid indication signal after 16 REF SB refreshes are continuously performed, that is, when the counting result is 16. In the foregoing counting process, the counting result represents a quantity of REF SB refreshes that are currently continuously performed. In the foregoing counting period, counting is reset if the control circuit 11 outputs the REF AB request.

The control circuit 11 outputs the RFM AB request or the RFM SB request according to the second address command after the indication circuit 13 outputs the valid indication signal. If the control circuit 11 outputs the RFM AB request, considering that RFM AB has a wider refresh range, there is no need to perform the RFM SB refresh. Therefore, counting resetting is performed. Correspondingly, the indication circuit 13 outputs the invalid indication signal again, and no longer performs the RFM SB refresh. However, if the control circuit 11 outputs the RFM SB request, the counting clock circuit 31 outputs a counting clock in response to the request. Correspondingly, the third flip-flop 33 accumulates the current RFM SB refresh, that is, the counting result is updated from 16 to 17 by increasing by 1. By analogy, the counting result is updated to 20 to reach the upper limit value 20 after one group of RFM SB refreshes is performed, that is, four RFM SB refreshes are continuously performed. The reset circuit 32 resets the third flip-flop 33, so that the counting result is reset to 0. The indication circuit 13 outputs the invalid indication signal, and the memory starts the normal refresh again. This process is performed cyclically.

In an example, as shown in FIG. 9, the counting clock circuit 31 includes a second AND gate 311 and a first OR gate 312. A first input terminal of the first OR gate 312 receives the REF SB request. A second input terminal of the first OR gate 312 is connected to an output terminal of the second AND gate 311. An output terminal of the first OR gate 312 is used as an output terminal of the counting clock circuit 31 and is connected to the clock terminal of the first stage of third flip-flop 33. A first input terminal of the second AND gate 311 receives the RFM SB request. A second input terminal of the second AND gate 311 receives the indication signal FLAG. In this example, the counting clock circuit includes an AND gate and an OR gate, so that the counting clock used for counting the quantity of same-bank refreshes is provided. In addition, the counting clock circuit is implemented by using a normal device, thereby further simplifying a circuit and a process, and reducing costs.

Figure 10:
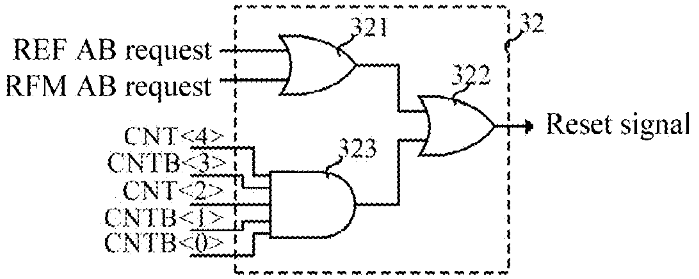
FIG. 10 is an example diagram of a structure of an example reset circuit.

To implement resetting in the foregoing case, in an example, FIG. 10 is an example diagram of a structure of an example reset circuit. As shown in FIG. 10, the reset circuit 32 includes a second OR gate 321, a third OR gate 322, and a fifth multi-input AND gate 323.

A first input terminal of the second OR gate 321 receives the RFM AB request. A second input terminal of the second OR gate 321 receives the REF AB request.

The fifth multi-input AND gate 323 has a plurality of input terminals configured to receive a plurality of first input signals and perform an AND logic operation. The plurality of first input signals correspond to a plurality of bits of the upper limit value. If any bit in the upper limit value is a high level, a corresponding first input signal is a corresponding bit of the counting result. If any bit in the upper limit value is a low level, a corresponding first input signal is an inverted signal of a corresponding bit of the counting result.

A first input terminal of the third OR gate 322 is connected to an output terminal of the second OR gate 321. A second input terminal of the third OR gate 322 is connected to an output terminal of the fifth multi-input AND gate 323. An output terminal of the third OR gate 322 is configured to output the reset signal.

It should be noted that in the figure, for example, an upper limit value of signals input to the fifth multi-input AND gate 323 is 20. The figure shows merely an example, and is not intended to exclude another possible implementation. For example, the upper limit value may alternatively be set to another value. Specifically, in the figure, based on the counting result, bits corresponding to the first input signals input to the fifth multi-input AND gate 323 are CNT<4> to CNT<0>. For example, the upper limit value is 20, and a binary representation thereof is 10100. Specifically, the fifth bit of the upper limit value is 1, and therefore, a corresponding first input signal is CNT<4>. The fourth bit of the upper limit value is 0, and therefore, a corresponding first input signal is an inverted signal CNTB<3> of CNT<3> (0). The third bit of the upper limit value is 1, and therefore, a corresponding first input signal is CNT<2>. By analogy, the other two first input signals are respectively inverted signals of CNT<1> and CNT<0>. It can be learned from the foregoing description that only when data including output results of the third flip-flops is 10100, the fifth multi-input AND gate 323 outputs a valid reset signal, that is, 1, so that counting resetting is performed in a timely manner when the counting result is the upper limit value.

The counter circuit in the foregoing example includes a counting clock circuit, a reset circuit, and a plurality of stages of flip-flops, so that a refresh quantity of continuous REF SB refreshes and REF SB refreshes is accurately counted, resetting is performed in a timely manner when the counting result reaches the upper limit value, and resetting is performed in a timely manner when it is detected in the counting process that the all-bank refresh is performed, thereby providing an accurate counting result for the indication circuit.

Figure 11:
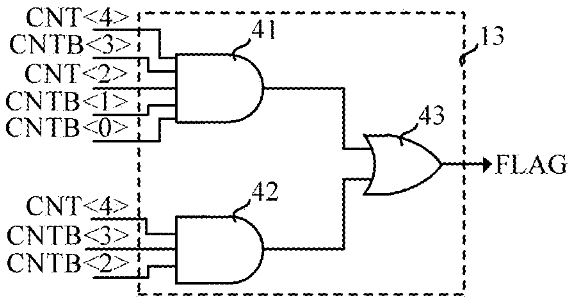
FIG. 11 is an example diagram of a structure of an example indication circuit.

Correspondingly, the indication circuit 13 outputs the indication signal based on the counting result. In an example, FIG. 11 is an example diagram of a structure of an example indication circuit. As shown in FIG. 11, the indication circuit 13 includes:

- a sixth multi-input AND gate 41, the sixth multi-input AND gate 41 having a plurality of input terminals configured to respectively receive an inverted signal of the first bit, an inverted signal of the second bit, a signal of the third bit, an inverted signal of the fourth bit, and a signal of the fifth bit in the current counting result;
- a seventh multi-input AND gate 42, the seventh multi-input AND gate 42 having a plurality of input terminals configured to respectively receive an inverted signal of the third bit, the inverted signal of the fourth bit, and the signal of the fifth bit in the current counting result; and
- a fourth OR gate 43, a first input terminal of the fourth OR gate 43 being connected to an output terminal of the sixth multi-input AND gate 41, a second input terminal of the fourth OR gate 43 being connected to an output terminal of the seventh multi-input AND gate 42, and an output terminal of the fourth OR gate 43 being configured to output the indication signal FLAG.

With reference to the example in the figure, in the counting result, the first bit is CNT<0>, the second bit is CNT<1>, the third bit is CNT<2>, the fourth bit is CNT<3>, and the fifth bit is CNT<4>. For example, the current counting result is 15. Correspondingly, CNT<4> to CNT<0> are 01111. Correspondingly, the inverted signal of the third bit, the inverted signal of the fourth bit, and the signal of the fifth bit in the counting result received by the seventh multi-input AND gate 42 are all 0. Therefore, the seventh multi-input AND gate 42 outputs 0, and correspondingly, the third AND gate 44 outputs 0. In addition, the inverted signal of the first bit, the inverted signal of the second bit, the inverted signal of the fourth bit, and the signal of the fifth bit in the counting result received by the sixth multi-input AND gate 41 are all 0. Therefore, the sixth multi-input AND gate 41 outputs 0. Correspondingly, the indication signal output by the fourth OR gate 43 is 0, which represents that the indication signal is invalid.

For another example, the counting result falls within the preset range. For example, the counting result is 16. Correspondingly, CNT<4> to CNT<0> are 10000. CNT<2> received by the sixth multi-input AND gate 41 is 0, and other inputs are 1. Therefore, the sixth multi-input AND gate 41 outputs 0. The inverted signal CNTB<2> of the third bit, the inverted signal CNTB<3> of the fourth bit, and the signal CNT<4> of the fifth bit in the counting result received by the seventh multi-input AND gate 42 are all 1. Therefore, the seventh multi-input AND gate 42 outputs 1. Correspondingly, the fourth OR gate 43 outputs 1, which represents that the indication signal is valid. For another example, the counting result is 17. Correspondingly, CNT<4> to CNT<0> are 10001. The signal CNT<2> of the third bit in the counting result received by the sixth multi-input AND gate 41 is 0, and other inputs are 1. Therefore, the sixth multi-input AND gate 41 outputs 0. The inverted signal CNTB<2> of the third bit, the inverted signal CNTB<3> of the fourth bit, and the signal CNT<4> of the fifth bit in the counting result received by the seventh multi-input AND gate 42 are all 1. Therefore, the seventh multi-input AND gate 42 outputs 1. Correspondingly, the fourth OR gate 43 outputs 1, which represents that the indication signal is valid. Similarly, different from the case in which the counting result is 17, CNT<1> and CNT<0> are 10 when the counting result is 18, and CNT<1> and CNT<0> are 11 when the counting result is 19. Regardless of whether the counting result is 17, 18, or 19, CNTB<2>, CNTB<3>, and CNT<4> received by the seventh multi-input AND gate are always 1. Therefore, the seventh multi-input AND gate 42 always outputs 1. In this case, for the sixth multi-input AND gate 41, CNT<2> is always 0 when the counting result is any value in 17 to 19. Therefore, the sixth multi-input AND gate 41 always outputs 0. When the counting result is 20, corresponding CNT<4> to CNT<0> are 10100, that is, CNT<4>, CNTB<3>, CNT<2>, CNTB<1>, and CNTB<0> that are received by the sixth multi-input AND gate 41 are all 1. Therefore, the sixth multi-input AND gate 41 outputs 1. In this case, the seventh multi-input AND gate 42 outputs 0 because CNTB<2> is 0. In the foregoing case, the indication circuit 13 keeps to output 1, that is, outputs valid FLAG. It should be noted that with reference to the foregoing example, when the counting result is 20, the reset circuit 32 is further triggered to reset counting. It can be understood that, after the counting result is reset to 00000, the indication circuit 13 outputs invalid FLAG, and the memory performs the normal refresh and counting again.

By using the indication circuit in the foregoing example, the valid indication signal can be output in a timely manner when the current counting result is in the preset range, and the indication circuit is implemented by using normal devices such as AND gates and an OR gate, thereby further simplifying a circuit and a process, and reducing costs.

Figure 12:
FIG. 12 shows an example refresh request counter.

It should be noted that division of structural modules in this embodiment is merely an example, and is not intended to exclude another division or combination manner. For example, in actual application, the counter circuit and the indication circuit may alternatively be used as a whole, for example, encapsulated into a single chip. With reference to an example in FIG. 12, FIG. 12 shows an example refresh request counter, configured to output the foregoing indication signal FLAG.

The refresh control circuit provided in this embodiment includes a control circuit, a counter circuit, and an indication circuit. When the refresh management feature is disabled, the control circuit determines, according to whether the indication signal is valid, whether to perform the normal refresh or the RFM refresh. Whether the indication signal is valid is determined by the indication circuit based on the counting result of the counter circuit for the accumulative quantity of same-bank normal refresh requests and same-bank refresh management refresh requests that are continuously output. In the foregoing solution, when the refresh management feature is disabled, the refresh request of a corresponding type is output based on the received address command signal and according to a state of the indication signal, so that an RH protection operation can still be implemented when the refresh management feature is disabled.

Embodiment 2

Figure 13:
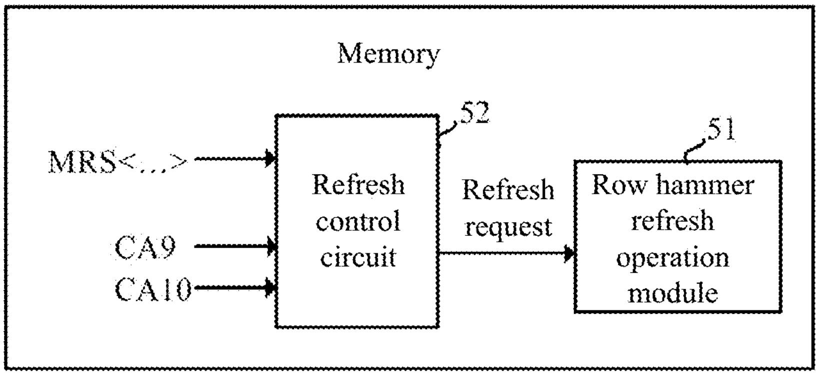
FIG. 13 is an example diagram of a structure of an example memory.

FIG. 13 is an example diagram of a structure of an example memory. As shown in FIG. 13, the memory includes a row hammer refresh operation module 51 and the refresh control circuit 52 described in any of the foregoing examples.

The row hammer refresh operation module 51 is connected to the refresh control circuit 52, and is configured to perform a row hammer refresh in response to an RFM SB request output by the refresh control circuit 52.

With reference to the solutions in the foregoing embodiment, a DRAM is used as an example. Based on the foregoing solution, when a refresh management feature of the memory is enabled, the refresh control circuit 52 outputs a corresponding refresh request according to an instruction delivered by a processor, so that the memory performs a refresh of a corresponding type according to the refresh request to implement RH protection. When the refresh management feature of the memory is disabled, the refresh control circuit 52 periodically switches an REF SB refresh request delivered by the processor to the RFM SB refresh request according to a set RFM SB refresh period and a quantity of continuous refreshes in each period, to implement RH protection. In addition, in the solution of this embodiment, a circuit originally configured to generate the RFM SB request is used ingeniously. When the RFM feature is disabled, the circuit is reused to generate a refresh request for RH protection, that is, a set of RH control circuits may be shared for REF SB and RFM SB, and there is no need to design a dedicated circuit for RH protection. Therefore, design difficulty and complexity of RH are further greatly simplified, and a circuit area is reduced.

In the memory provided in this embodiment, the refresh control circuit includes a control circuit, a counter circuit, and an indication circuit. When the refresh management feature is disabled, the control circuit determines, according to whether the indication signal is valid, whether to perform a normal refresh or an RFM refresh. Whether the indication signal is valid is determined by the indication circuit based on the counting result of the counter circuit for the accumulative quantity of same-bank normal refresh requests and same-bank refresh management refresh requests that are continuously output. In the foregoing solution, when the refresh management feature is disabled, the refresh request of a corresponding type is output based on the received address command signal and according to a state of the indication signal, so that an RH protection operation can still be implemented when the refresh management feature is disabled.

A person skilled in the art can easily figure out other implementation solutions of this application after considering the specification and practice of the present disclosure herein. This application aims to cover any variations, uses, or adaptations of this application. These variations, uses, or adaptations follow the general principles of this application and include common knowledge or conventional technical means in the art that are not disclosed in this application. The specification and embodiments are merely considered to be exemplary.

It should be understood that this application is not limited to the precise structures described above and shown in the accompanying drawings, and various modifications and changes may be made without departing from the scope thereof.

What is claimed is:

1. A refresh control circuit, applied to a memory, and comprising a control circuit, a counter circuit, and an indication circuit;

the control circuit being connected to an output terminal of the indication circuit, and being configured to: when a refresh management feature is disabled, output an all-bank normal refresh request or a same-bank normal refresh request according to a received address command signal if the indication circuit currently outputs an invalid indication signal, or output an all-bank refresh management refresh request or a same-bank refresh management refresh request according to a received address command signal if the indication circuit currently outputs a valid indication signal, and the same-bank refresh management refresh request being configured to indicate to perform a row hammer refresh;

the counter circuit being connected to an output terminal of the control circuit, and being configured to count an accumulative quantity of same-bank normal refresh requests and same-bank refresh management refresh requests that are continuously output by the control circuit, output a counting result, and perform resetting and start counting again in response to the current counting result reaching a set upper limit value or when the control circuit outputs the all-bank normal refresh request or the all-bank refresh management refresh request; and the indication circuit being connected to an output terminal of the counter circuit, and being configured to output the valid indication signal if the current counting result is in a preset range, or output the invalid indication signal if the current counting result is not in a preset range.

2. The refresh control circuit according to claim 1, wherein the control circuit is further configured to output an all-bank normal refresh request, a same-bank normal refresh request, an all-bank refresh management refresh request, or a same-bank refresh management refresh request according to a received address command signal when the refresh management feature is enabled; and the address command signal comprises a first address command and a second address command, different level states of the first address command respectively represent a normal refresh type and a refresh management refresh type, and different level states of the second address command respectively represent an all-bank refresh type and a same-bank refresh type.

3. The refresh control circuit according to claim 2, wherein the control circuit comprises:

a first control sub-circuit, configured to receive a mode register instruction, the first address command, and the indication signal to detect whether the refresh management feature is enabled according to the mode register instruction and output a first signal with reference to the first address command and the indication signal, a first signal consistent with the first address command being output if the refresh management feature is enabled, or if the refresh management feature is disabled, a first signal representing the normal refresh type being output in response to the currently invalid indication signal and a first signal representing the refresh management refresh type being output in response to the currently valid indication signal;

a transmission circuit, configured to receive the second address command to output the second address command as a second signal after delaying the second address command by predetermined duration; and a decoding circuit, connected to the first control sub-circuit and the transmission circuit, and configured to receive the first signal and the second signal, and output a refresh request of a corresponding type according to level states of the first signal and the second signal in response to a refresh command.

4. The refresh control circuit according to claim 3, wherein the first control sub-circuit comprises a first NOT gate, a first NAND gate, a second NOT gate, a second NAND gate, and a first AND gate;

a first input terminal of the first NAND gate receives the indication signal, an input terminal of the first NOT gate receives the mode register instruction, an output terminal of the first NOT gate is connected to a second input terminal of the first NAND gate, and an output terminal of the first NAND gate is connected to a first input terminal of the first AND gate;

a first input terminal of the second NAND gate receives the mode register instruction, an input terminal of the second NOT gate receives the first address command, an output terminal of the second NOT gate is connected to a second input terminal of the second NAND gate, and an output terminal of the second NAND gate is connected to a second input terminal of the first AND gate; and an output terminal of the first AND gate is configured to output the first signal, the refresh management feature is enabled when the mode register instruction is at a high level, the refresh management feature is disabled when the mode register instruction is at a low level, the indication signal is valid when the indication signal is at a high level, and the indication signal is invalid when the indication signal is at a low level.

5. The refresh control circuit according to claim 3 wherein the transmission circuit comprises an even number of third NOT gates and a first buffer that are sequentially connected in series; and an input terminal of a first third NOT gate receives the second address command, an output terminal of a last third NOT gate is connected to an input terminal of the first buffer, and an output terminal of the first buffer is configured to output the second signal.

6. The refresh control circuit according to claim 3, wherein the decoding circuit comprises:

a first flip-flop, an input terminal of the first flip-flop receiving the first signal, an in-phase output terminal of the first flip-flop being configured to output a first sub-signal, an inverting output terminal of the first flip-flop being configured to output a second sub-signal, and a clock terminal of the first flip-flop receiving the refresh command;

a second flip-flop, an input terminal of the second flip-flop receiving the second signal, an in-phase output terminal of the second flip-flop being configured to output a third sub-signal, an inverting output terminal of the second flip-flop being configured to output a fourth sub-signal, and a clock terminal of the second flip-flop receiving the refresh command;

a second buffer, an input terminal of the second buffer receiving the refresh command, and the second buffer being configured to output the refresh command after delaying the refresh command;

a first multi-input AND gate, an input terminal of the first multi-input AND gate being separately connected to the second sub-signal, the fourth sub-signal, and an output terminal of the second buffer, and the first multi-input AND gate being configured to output the all-bank refresh management refresh request;

a second multi-input AND gate, an input terminal of the second multi-input AND gate being separately connected to the first sub-signal, the fourth sub-signal, and the output terminal of the second buffer, and the second multi-input AND gate being configured to output the all-bank normal refresh request;

a third multi-input AND gate, an input terminal of the third multi-input AND gate being separately connected to the first sub-signal, the third sub-signal, and the output terminal of the second buffer, and the third multi-input AND gate being configured to output the same-bank normal refresh request; and a fourth multi-input AND gate, an input terminal of the fourth multi-input AND gate being separately connected to the second sub-signal, the third sub-signal, and the output terminal of the second buffer, and the fourth multi-input AND gate being configured to output the same-bank refresh management refresh request.

7. The refresh control circuit according to claim 1, wherein the counter circuit comprises a counting clock circuit, a reset circuit, and a plurality of stages of third flip-flops corresponding to binary bits;

the counting clock circuit is connected to the control circuit, and is configured to output a counting clock when the same-bank normal refresh request is received or when the current indication signal is valid and the same-bank refresh management refresh request is received;

a clock terminal of a first stage of third flip-flop is connected to an output terminal of the counting clock circuit, a clock terminal of another third flip-flop is connected to an inverting output terminal of a previous stage of third flip-flop, an input terminal of each third flip-flop is connected to an inverting output terminal of the third flip-flop, a value output by an in-phase output terminal of each stage of third flip-flop constitutes an output of the counter circuit, and the output is a binary representation of the counting result; and an input terminal of the reset circuit is connected to output terminals of the control circuit and the plurality of stages of third flip-flops, and is configured to output a reset signal when the all-bank normal refresh request or the all-bank refresh management refresh request is received or when the counting result is the upper limit value, and an output terminal of the reset circuit is connected to a reset terminal of each stage of third flip-flop.

8. The refresh control circuit according to claim 7, wherein the counting clock circuit comprises a second AND gate and a first OR gate;

a first input terminal of the first OR gate receives the same-bank normal refresh request, a second input terminal of the first OR gate is connected to an output terminal of the second AND gate, and an output terminal of the first OR gate is connected to the clock terminal of the first stage of third flip-flop as an output terminal of the counting clock circuit; and a first input terminal of the second AND gate receives the same-bank refresh management refresh request, and a second input terminal of the second AND gate receives the indication signal.

9. The refresh control circuit according to claim 7, wherein the reset circuit comprises a second OR gate, a third OR gate, and a fifth multi-input AND gate;

a first input terminal of the second OR gate receives the all-bank refresh management refresh request, and a second input terminal of the second OR gate receives the all-bank normal refresh request;

the fifth multi-input AND gate has a plurality of input terminals configured to receive a plurality of first input signals and perform an AND logic operation, the plurality of first input signals correspond to a plurality of bits of the upper limit value, and if any bit in the upper limit value is a high level, a corresponding first input signal is a corresponding bit of the counting result, or if any bit in the upper limit value is a low level, a corresponding first input signal is an inverted signal of a corresponding bit of the counting result; and a first input terminal of the third OR gate is connected to an output terminal of the second OR gate, a second input terminal of the third OR gate is connected to an output terminal of the fifth multi-input AND gate, and an output terminal of the third OR gate is configured to output the reset signal.

10. The refresh control circuit according to claim 1, wherein the preset range is 16 to 20.

11. The refresh control circuit according to claim 10, wherein the indication circuit comprises:

a sixth multi-input AND gate, the sixth multi-input AND gate having a plurality of input terminals configured to respectively receive an inverted signal of the first bit, an inverted signal of the second bit, a signal of the third bit, an inverted signal of the fourth bit, and a signal of the fifth bit in the current counting result;

a seventh multi-input AND gate, the seventh multi-input AND gate having a plurality of input terminals configured to respectively receive an inverted signal of the third bit, the inverted signal of the fourth bit, and the signal of the fifth bit in the current counting result; and a fourth OR gate, a first input terminal of the fourth OR gate being connected to an output terminal of the sixth multi-input AND gate, a second input terminal of the fourth OR gate being connected to an output terminal of the seventh multi-input AND gate, and an output terminal of the fourth OR gate being configured to output the indication signal.

12. A memory, comprising a row hammer refresh operation module and the refresh control circuit according to claim 1; and the row hammer refresh operation module being connected to the refresh control circuit, and being configured to perform a row hammer refresh in response to a same-bank refresh management refresh request output by the refresh control circuit.

* * * * *